United States Patent
Kasahara et al.

(10) Patent No.: US 8,748,756 B2
(45) Date of Patent: Jun. 10, 2014

(54) ELECTRIC DEVICE AND PRODUCTION METHOD THEREFOR

(75) Inventors: Kenji Kasahara, Niihama (JP); Masaya Shimizu, Niihama (JP); Tomoki Kurata, Niihama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/583,169

(22) PCT Filed: Mar. 4, 2011

(86) PCT No.: PCT/JP2011/055139
§ 371 (c)(1),
(2), (4) Date: Oct. 24, 2012

(87) PCT Pub. No.: WO2011/111637
PCT Pub. Date: Sep. 15, 2011

(65) Prior Publication Data
US 2013/0033839 A1 Feb. 7, 2013

(30) Foreign Application Priority Data
Mar. 11, 2010 (JP) .............................. P2010-054224

(51) Int. Cl.
*H01L 23/28* (2006.01)
(52) U.S. Cl.
USPC ............ 174/524; 174/539; 257/40; 29/592.1
(58) Field of Classification Search
USPC ..................... 257/40; 174/539, 524; 29/592.1
See application file for complete search history.

(56) References Cited

U.S. PATENT DOCUMENTS

| 2006/0082298 A1 | 4/2006 | Becken et al. |
| 2007/0128967 A1 | 6/2007 | Becken et al. |
| 2007/0170854 A1* | 7/2007 | Kwak ........................... 313/512 |
| 2007/0171637 A1 | 7/2007 | Choi |
| 2011/0186822 A1* | 8/2011 | Adachi ........................... 257/40 |

(Continued)

FOREIGN PATENT DOCUMENTS

| JP | 2007-200835 A | 8/2007 |
| JP | 2007-200839 A | 8/2007 |

(Continued)

OTHER PUBLICATIONS

International Preliminary Report on Patentability and Written Opinion issued Oct. 11, 2012 in International Application No. PCT/JP2011/055139 to Sumitomo Chemical Co., Ltd.

(Continued)

*Primary Examiner* — Hung Ngo
(74) *Attorney, Agent, or Firm* — Sughrue Mion, PLLC

(57) ABSTRACT

An electric device includes a support substrate 12, an electric circuit 14 provided in a sealing region set on the support substrate 12, an electric wiring provided on the support substrate 12 for electrically connecting an external electrical signal input/output source with the electric circuit 14, a sealing member 16 provided on the support substrate 12 to surround the sealing region, and a sealing substrate 17 bonded to the support substrate 12 with the sealing member 16 interposed therebetween. the electric circuit 14 includes an electronic element 24 having an organic layer, and a width of the sealing member 16 differs between an intersection region in which the electric wiring 15 and the sealing member 16 intersect each other and a non-intersection region excluding the intersection region.

8 Claims, 9 Drawing Sheets

(56) References Cited

U.S. PATENT DOCUMENTS

2011/0204348 A1* 8/2011 Nishizeki et al. ............... 257/40
2012/0261684 A1* 10/2012 Koshihara ....................... 257/89
2012/0319092 A1* 12/2012 Shimomura .................... 257/40

FOREIGN PATENT DOCUMENTS

| JP | 2008-517446 A | 5/2008 |
| JP | 2008-532207 A | 8/2008 |
| JP | 2008-288376 A | 11/2008 |
| JP | 2009-205941 A | 9/2009 |

OTHER PUBLICATIONS

Notice of Reasons for Rejection issued Feb. 4, 2014 in Japanese Patent Application No. P2010-054224 with English translation.

* cited by examiner

ELECTRIC DEVICE AND PRODUCTION METHOD THEREFOR

TECHNICAL FIELD

The present invention relates to an electric device and a production method therefor.

BACKGROUND ART

Electronic elements such as organic EL (Electro Luminescence) elements, organic photoelectric transducer elements and organic transistors have an organic layer as one of components. Such an electronic element is easily degraded when coming into contact with the air in comparison with an electronic element not having an organic layer. Therefore, in an electric device in which electronic elements having an organic layer is mounted, sealing is performed in order to prevent degradation of the elements.

The sealing is performed, for example, by arranging a sealing member so as to surround electronic elements mounted on a support substrate and by bonding a sealing substrate to the support substrate with the sealing member interposed therebetween. That is, a region surrounded by the support substrate, the sealing substrate, and the sealing member is insulated from the outside. A member that hardly allows gas to pass through is used as the sealing member. Frit seal using glass as such a sealing member is contemplated as one of sealing methods. Frit is flake-like or powder-like glass (hereinafter also simply referred to as "frit glass powder") that melts at low temperatures as compared with normal glass. A paste-like fit agent in which fit glass powder is dispersed in a solvent is used for fit seal.

In fit seal, first, a frit agent is supplied to a support substrate having electronic elements mounted thereon so as to surround the electronic elements, and then, preliminary baking is generally performed in order to remove a solvent component in the fit agent. Thereafter, a sealing substrate is bonded to the support substrate with the frit agent interposed therebetween. Then, the frit agent is irradiated with laser light so that the fit agent is heated and fused. When the irradiation of laser light is stopped, the temperature of the fit agent drops and the fit agent is hardened again. The sealing member is thus formed, and the region surrounded by the support substrate, the sealing substrate, and the sealing member is hermetically sealed.

The heating of the fit agent is performed by irradiating throughout the entire periphery thereof with laser light. However, when heating variations occur at that time, the fused state varies from place to place. As a result, the adhesion between the sealing substrate or the support substrate and the sealing member, or the characteristics of the sealing member becomes uneven, leading to reduction in reliability of the sealing. Therefore, in frit seal, it is necessary to heat and fuse the fit agent uniformly throughout the entire periphery.

However, irradiating throughout the entire periphery of the fit agent with laser light alone usually causes heating variations in the frit agent. The frit agent is provided on a prescribed underlying layer. In general, the underlying layer is not always formed of a uniform member. In the underlying layer, an easily heated part and a hardly heated part exist. Therefore, even if the frit agent is irradiated with laser light uniformly, heating variations may occur in the frit agent due to the thermal characteristics of the underlying layer. For example, in an electric device, a lot of electric wirings for inputting/outputting electrical signals to electronic elements are provided so as to intersect the fit agent. The heating characteristics differ between a place where the electric wiring is provided and a place where the electric wiring is not provided when irradiated with laser light. For example, in a case where laser light having a spot diameter larger than the width of the fit agent is used, or in a case where part of laser light passes through the frit agent, the underlying layer is also irradiated with the laser light, so that the temperature of the underlying layer as well as the frit agent is increased. The electric wiring is heated by laser light more easily than any other member. Therefore, transfer of heat from the frit agent provided on the electric wiring to the underlying layer is suppressed. As a result, the temperature of the frit agent provided on the electric wiring becomes higher than the frit agent provided in the place where electric wiring is not provided. As described above, irradiating the frit agent uniformly with laser light alone does not allow the fit agent to be uniformly heated and fused.

Then, in a conventional technique, a plurality of holes are provided in a stripe-shaped electric wiring in a region where the stripe-shape electric wiring and the fit agent intersect each other, whereby a temperature increase of the electric wiring is prevented during heating, and the fit agent is heated and fused uniformly throughout the entire periphery thereof (see, for example, Patent Literature 1).

CITATION LIST

Patent Literature

Patent Literature 1: Japanese Patent Application Laid-Open Publication No. 2007-200835

SUMMARY OF INVENTION

Technical Problem

In the case where holes are formed in the stripe-shaped electric wiring as described above, only forming holes increases the electrical resistance of the electric wiring accordingly. Thus, in the conventional technique, in order to reduce the electric resistance, the width of the electric wiring is set greater at a place where the hole is provided.

In an electric device that requires a number of electric wirings, the electric wirings are densely provided. In this case, it is sometimes difficult to set the electric wiring wide only at the region where the electric wiring intersects the fit agent. As described above, the conventional technique has a problem of reducing flexibility of design.

An object of the present invention is therefore to provide an electric device configured such that a sealing material can be uniformly heated and fused without reducing flexibility of design.

Solution to Problem

An electric device according to the present invention includes a support substrate, an electric circuit provided in a sealing region set on the support substrate, an electric wiring provided on the support substrate to extend from an inside of the sealing region to an outside of the sealing region for electrically connecting an external electrical signal input/output source with the electric circuit, a sealing member provided on the support substrate to surround the sealing region, and a sealing substrate bonded to the support substrate with the sealing member interposed therebetween. The electric circuit includes an electronic element having an organic layer. In a two-dimensional view, a width of the sealing member differs between an intersection region in which the electric wiring and the sealing member intersect each other and a non-intersection region excluding the intersection region.

In the electric device, it is preferable that a width A of the sealing member at the intersection region be greater than a width B of the sealing member at the non-intersection region.

In the electric device, it is preferable that the electronic element be an organic EL element, an organic photoelectric transducer element, or an organic transistor.

A method of producing the electric device according to the present invention includes the steps of: preparing the support substrate on which the electric circuit and the electric wiring are provided; supplying a sealing material serving as the sealing member along an outer periphery of the sealing region; bonding the sealing substrate to the support substrate with the sealing material serving as the sealing member interposed therebetween; irradiating the sealing material serving as the sealing member with an electromagnetic beam to heat and fuse the sealing material; and forming the sealing member by cooling and hardening the sealing material. In the step of supplying a sealing material, a width of the supplied sealing material is varied between the intersection region and the non-intersection region.

In the method of producing the electric device, it is preferable that throughout an entire region in which the sealing material is arranged is irradiated with the electromagnetic beam at an identical light intensity.

In the method of producing the electric device, it is preferable that a spot diameter C of the electromagnetic beam be greater than a width B of the sealing member at the non-intersection region.

In the method of producing the electric device, it is preferable that a width A of the sealing member at the intersection region be greater than the width B of the sealing member at the non-intersection region, and that the spot diameter C of the electromagnetic beam be equal to the width A of the sealing member at the intersection region or greater than the width A. In this case, it is ensured that the sealing member is heated and fused.

In the method of producing the electric device, it is preferable that a width A of the sealing member at the intersection region be greater than the width B of the sealing member at the non-intersection region, and that the spot diameter C of the electromagnetic beam be smaller than the width A of the sealing member at the intersection region. Even when the spot diameter C is smaller than the width A, the sealing member can be heated and fused because the heating is promoted more in the intersection region than in the non-intersection region.

Effects of Invention

The present invention can provide an electric device configured such that a sealing material can be uniformly heated and fused without reducing flexibility of design.

DESCRIPTION OF EMBODIMENTS

An electric device according to the present invention includes a support substrate, an electric circuit provided in a sealing region set on the support substrate, an electric wiring provided on the support substrate to extend from an inside of the sealing region to an outside of the sealing region for electrically connecting an external electrical signal input/output source with the electric circuit, a sealing member provided on the support substrate to surround the sealing region, and a sealing substrate bonded to the support substrate with the sealing member interposed therebetween. The electric circuit includes an electronic element having an organic layer. In a two-dimensional view, a width of the sealing member differs between an intersection region in which the electric wiring and the sealing member intersect each other and a non-intersection region excluding the intersection region.

The electric device of the present invention is applicable to any electric devices in which an electric circuit including an electronic element having an organic layer is installed. Examples of the electronic element having an organic layer include an organic EL element, an organic photoelectric transducer element, and an organic transistor. For example, the electric device of the present invention is applicable to a display device in which an organic EL element for use as a light source or a backlight for pixels is installed in an electric circuit, a photoelectric transducer in which an organic photoelectric transducer element for use as a solar cell or an optical sensor is installed in an electric circuit, and an electric device in which an organic transistor used to drive or control the organic EL element, the organic photoelectric transducer element, and any other electronic element is installed in an electric circuit. In the following, the electric device of the present invention will be described taking a display device in which an organic EL element for use as a light source for pixels is installed in an electric circuit, as an example.

Display devices mainly include an active matrix driven type device and a passive matrix driven type device. The present invention is applicable to display devices of both kinds. In the present embodiment, an active matrix driven type display device will be described by way of example.

<Configuration of Display Device>

Figure 1:
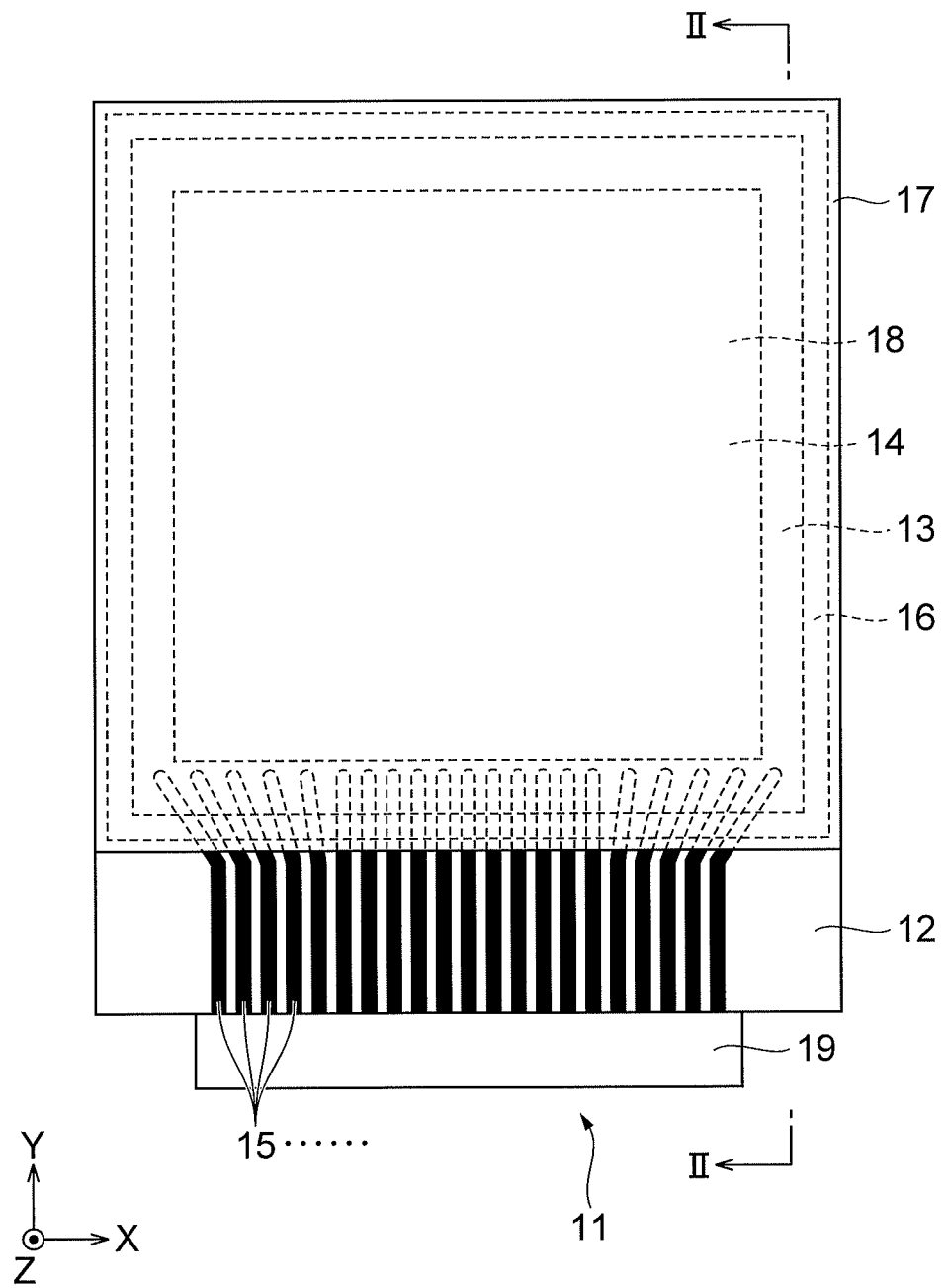
FIG. 1 is a plan view schematically illustrating a display device 11 according to the present embodiment.
Figure 2:
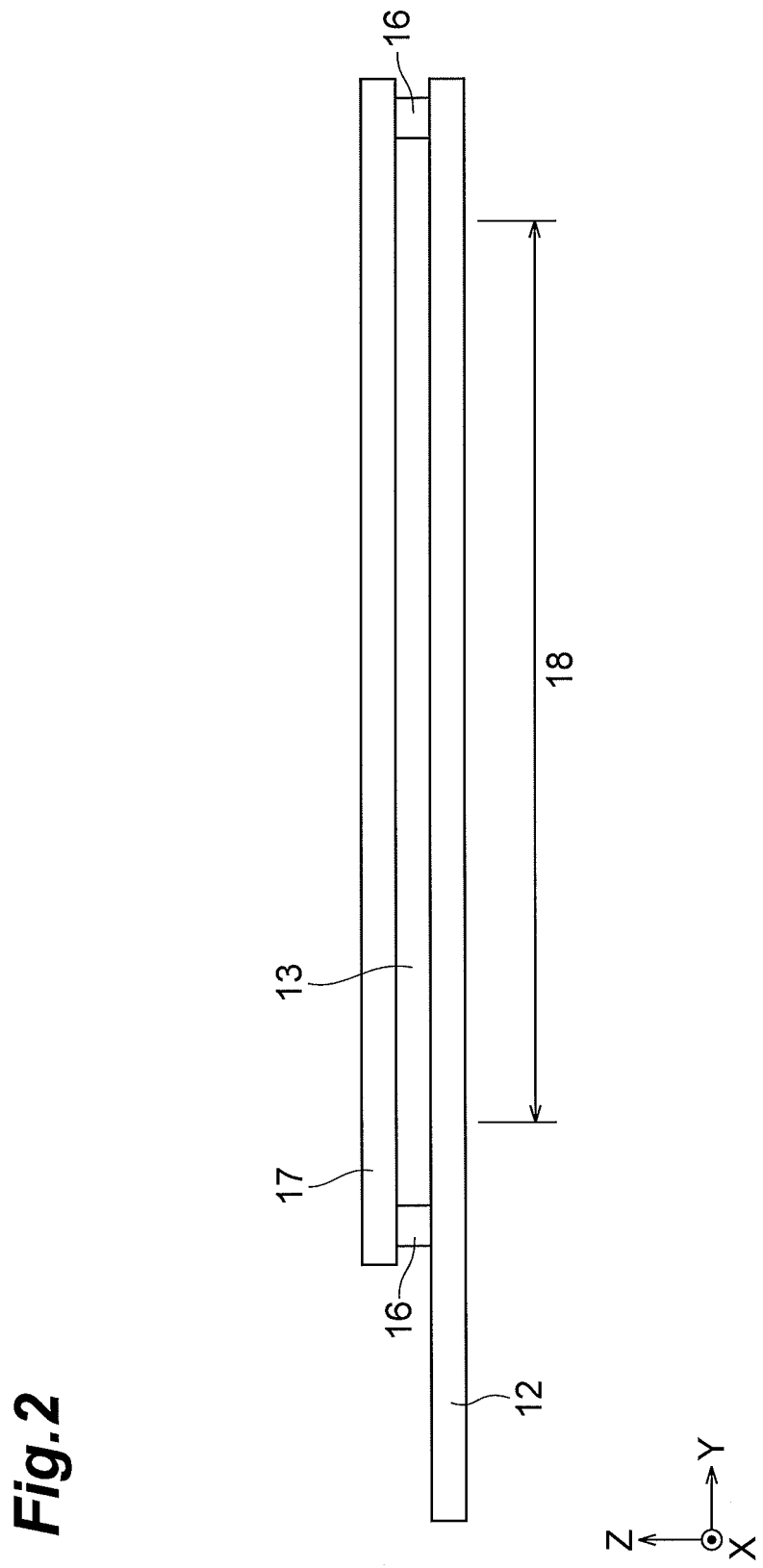
FIG. 2 is a cross-sectional view of the display device 11 as viewed from a section line II-II depicted in FIG. 1.
Figure 7:
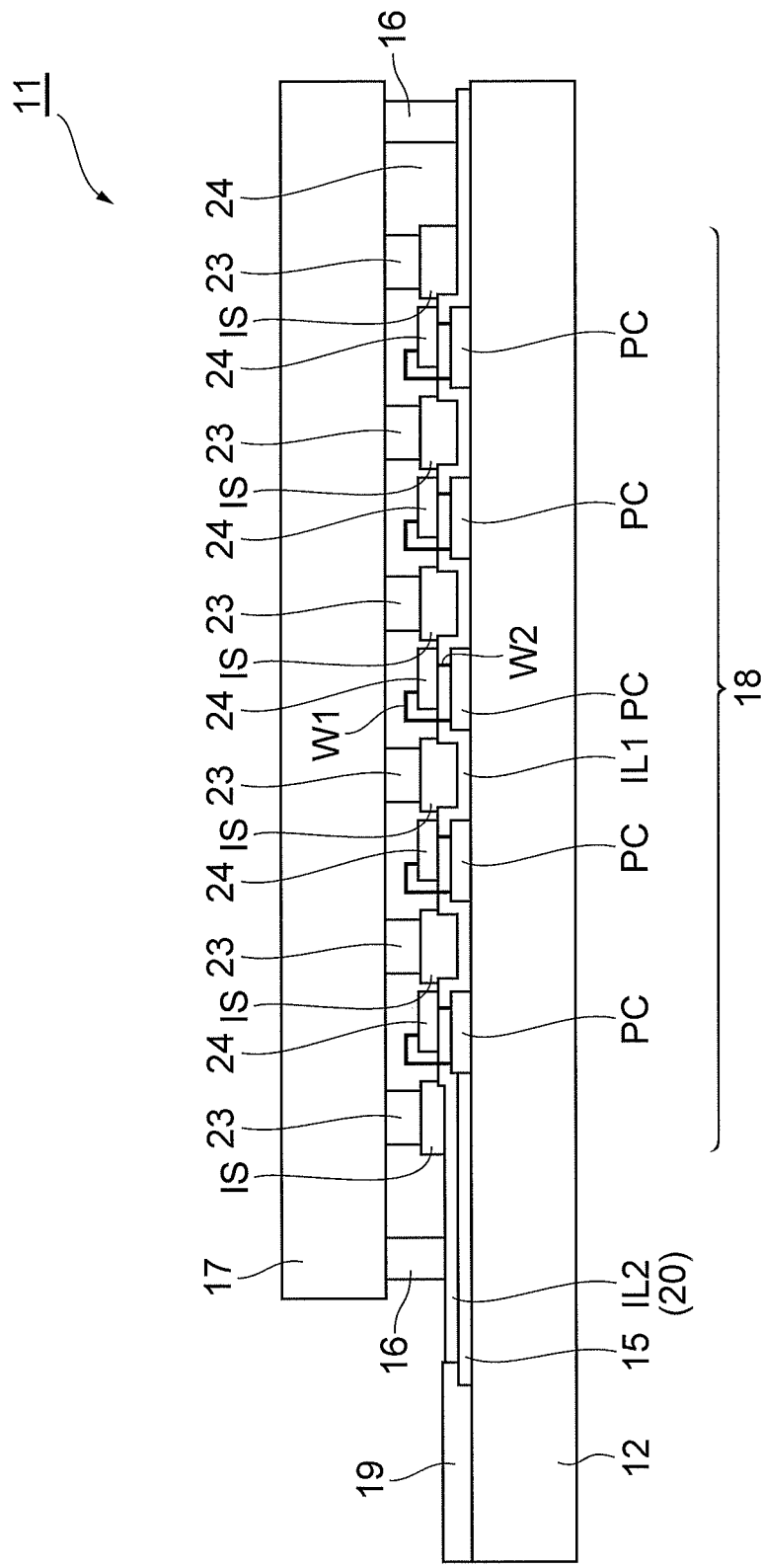
FIG. 7 is a diagram illustrating a section structure of the display device depicted in FIG. 1.

First, a configuration of a display device 11 as an electric device will be described. FIG. 1 is a plan view schematically illustrating the display device 11 in the present embodiment. FIG. 2 is a cross-sectional view of the display device 11 as viewed from a section line II-II depicted in FIG. 1. Similar to FIG. 2, FIG. 7 is a diagram illustrating details of a section structure through EL elements that constitute an electric circuit 14 in the display device depicted in FIG. 1. The display device 11 includes a support substrate 12, the electric circuit 14 provided in a sealing region 13 set on the support substrate 12, an electric wiring 15 provided on the support substrate 12 to extend from the inside of the sealing region 13 to the outside of the sealing region 13 for electrically connecting an external electrical signal input/output source 19 with the electric circuit 14, a sealing member 16 provided on the support substrate to surround the sealing region 13, and a sealing substrate 17 bonded to the support substrate 12 with the sealing member 16 interposed therebetween.

In FIG. 1, a portion provided on a surface of the substrate 12 and having a rectangular annular shape corresponds to the sealing member 16, and a portion surrounded with the sealing member 16 corresponds to the sealing region 13.

In the present embodiment, the electric circuit 14 depicted in FIG. 1 is configured to include a number of organic EL elements (electronic elements) 24 for use as light sources for pixels and pixel circuits PC for individually driving the organic EL elements 24, as depicted in FIG. 7. The organic EL element 24 is positioned between isolation walls IS and filled in a space between them. However, for the sake of clarity of description, FIG. 7 depicts that the isolation wall IS and the organic EL element 24 are slightly spaced apart from each other. The pixel circuits PC illustrated in FIG. 7 are formed in a region for displaying image information (hereinafter also referred to as an image display region 18) as viewed from one side in the thickness direction of the support substrate 12 (hereinafter also referred to as "in a two dimensional view"). The pixel circuit PC is formed of an organic transistor, an inorganic transistor, a capacitor, and other elements. An insulating film IL1 that covers the pixel circuit PC is formed on the pixel circuit PC provided on the support substrate 12. The insulating film IL1 is formed of, for example, an organic insulating film made of resin or an inorganic insulating film. It is preferable to use a heat-resistant film for the insulating film IL1 because part of the insulating film IL1 is heated when a frit agent is heated and fused. Therefore, of the insulating film IL1, at least the insulating film IL1 provided at a place heated when the frit agent is heated and fused is preferably formed of an inorganic insulating film in terms of heat resistance. Examples of such an inorganic insulating film used include metal oxide films such as a silicon oxide film, a silicon nitride film, and a silicon oxynitride film. The thickness of the inorganic insulating film is generally about 50 nm to 3000 nm. The insulating film IL1 can be formed by a known deposition method such as plasma CVD or sputtering in a process of forming the electric circuit 14.

A number of organic EL elements 24 depicted in FIG. 7 are each provided on the pixel circuit PC. That is, the organic EL elements 24 are each provided on the insulating film IL1 described above or a flattening film in which the surface thereof is flattened by thickening the insulating film IL1 in the image display region 18. The organic EL elements are arranged, for example, in a matrix and are arranged at prescribed intervals in a row direction X and a column direction Y in the image display region 18. Each organic EL element and the pixel circuit PC are electrically connected with each other through conductors W1 and W2 passing through the insulating film IL1 or the flattening film in the thickness direction. Specifically, the conductor W1 is connected to an upper electrode E1 (see FIG. 8) of the organic EL element 24, and the conductor W2 is connected to a lower electrode E2 (see FIG. 8) of the organic EL element 24. The conductors W1 and W2 are each connected to the pixel circuit PC.

A simple pixel circuit PC is formed of a single transistor. An external electric wiring 15 is connected to the gate of the transistor. Another terminal of the transistor is connected to a power supply potential and the other terminal is connected to the upper electrode E1 (see FIG. 8) of the EL element. The lower electrode E2 (see FIG. 8) of the EL element is connected to the ground potential. When the gate receives input through the electric wiring 15, the transistor turns on, so that voltage is applied between the electrodes E1 and E2 of the organic EL element 24 to cause a light-emitting layer EL (see FIG. 8) therebetween to emit light.

As described above, the electric circuit 14 is provided in the inside of the sealing region 13 set on the support substrate 12. In other words, the sealing region 13 is set in a region that contains the image display region 18 in which the electric circuit 14 is provided.

The support substrate 12 having the electric circuit 14 thereon is formed of, for example, a glass substrate, a metal plate, a resin film, and a stacked structure thereof. In the case where the bottom emission-type organic EL elements that emit light toward the support substrate 12 are mounted on the support substrate 12, the support substrate 12 is formed of a light-transmitting member.

Many electric wirings 15 for inputting a prescribed electrical signal to the electric circuit 14 are provided in the display device 11. The prescribed electrical signal is an electrical signal for allowing each of a number of organic EL elements to individually emit light at a prescribed light intensity, and means, for example, an electrical signal for individually selecting an element to emit light among the organic EL elements arranged in a matrix, or an electrical signal for designating a light emission intensity of each element. A lot of electric wirings for transmitting electrical signals are required because a number of organic EL elements are provided in the display device 11. The electrical signal is input from an external electrical signal input/output source 19. In the display device 11, the electrical signal input/output source 19 is implemented by a driver. A lot of electric wirings 15 are provided for the purpose of connecting the electrical signal input/output source 19 with the electric circuit and thus are provided to extend from the inside of the sealing region 13 to the outside of the sealing region 13 on the support substrate 12. Generally, an insulating film 20 is also provided on a lot of electric wirings 15. In other words, the plurality of electric wirings 15 are generally covered with the insulating film 20. A lot of electric wirings 15 may radially extend around the electric circuit 14 from the inside of the sealing region 13 to the outside of the sealing region 13. However, in the present embodiment, as illustrated in FIG. 1, the electric wirings 15 extend from the inside of the sealing region 13 to the outside of the sealing region 13 through one side of the outer periphery of the sealing region 13 so as to converge into the electrical signal input/output source 19. The external electrical signal input/output source 19 is provided outside the sealing region 13 and may be included as a driver in the electric device as in the present embodiment or may not be included in the electric device.

The electric wiring 15 is formed of a metal thin film having high conductivity or a transparent conductive oxide. Specifically, the electric wiring 15 is formed of a thin film of Al, Cu, Cr, W, Mo, ITO, or IZO, or a stacked film thereof. The thickness of the electric wiring is generally about 100 nm to 5000 nm, and the width thereof is generally about 10 μm to 200 μm.

The sealing member 16 is provided on the support substrate 12 so as to surround the sealing region 13 along the outer periphery of the sealing region 13. In other words, the sealing region 13 is a region surrounded by the sealing member 16, and the outer periphery thereof is defined by the sealing member 16. As a lot of electric wirings 15 are provided to extend from the inside of the sealing region 13 to the outside of the sealing region 13 as described above, the sealing member 16 extending along the outer periphery of the sealing region is arranged so as to intersect a lot of electric wirings 15 in a two-dimensional view. In the present embodiment, the sealing member 16 is provided on the electric wirings 15 with the insulating film 20 interposed (see FIG. 4) because a lot of electric wirings 15 are covered with the insulating film 20 as previously mentioned. An insulating film IL1 and the insulating film 20 may be formed of a common insulating film, or may be formed of different insulating films. In this example, the insulating film 20 and the insulating film IL1 are common to each other, and the insulating film 20 is a common insulating film IL2.

Figure 3:
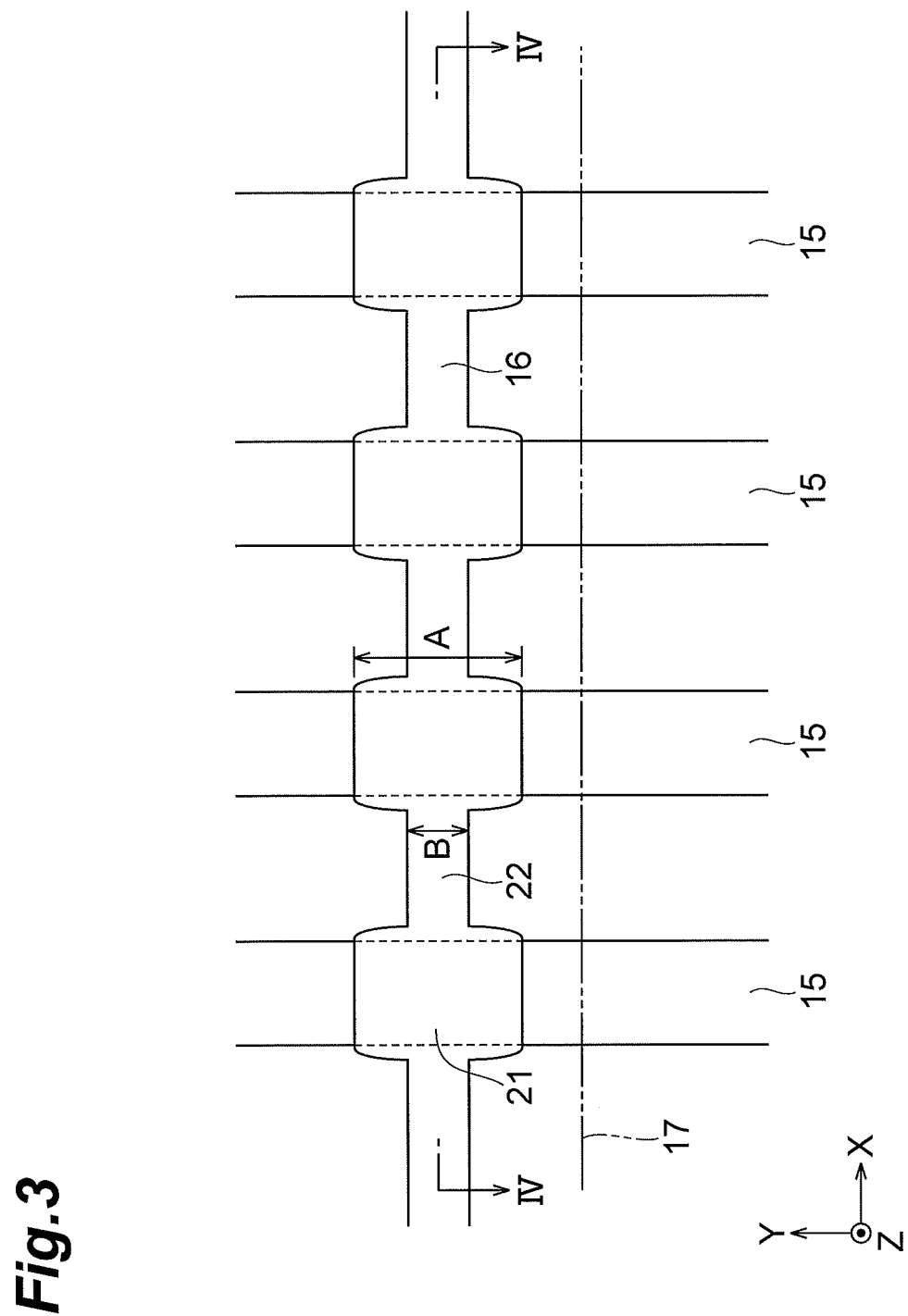
FIG. 3 is an enlarged plan view schematically illustrating a region in which an intersection region 21 and a non-intersection region 22 alternately appear in a sealing member 16.
Figure 4:
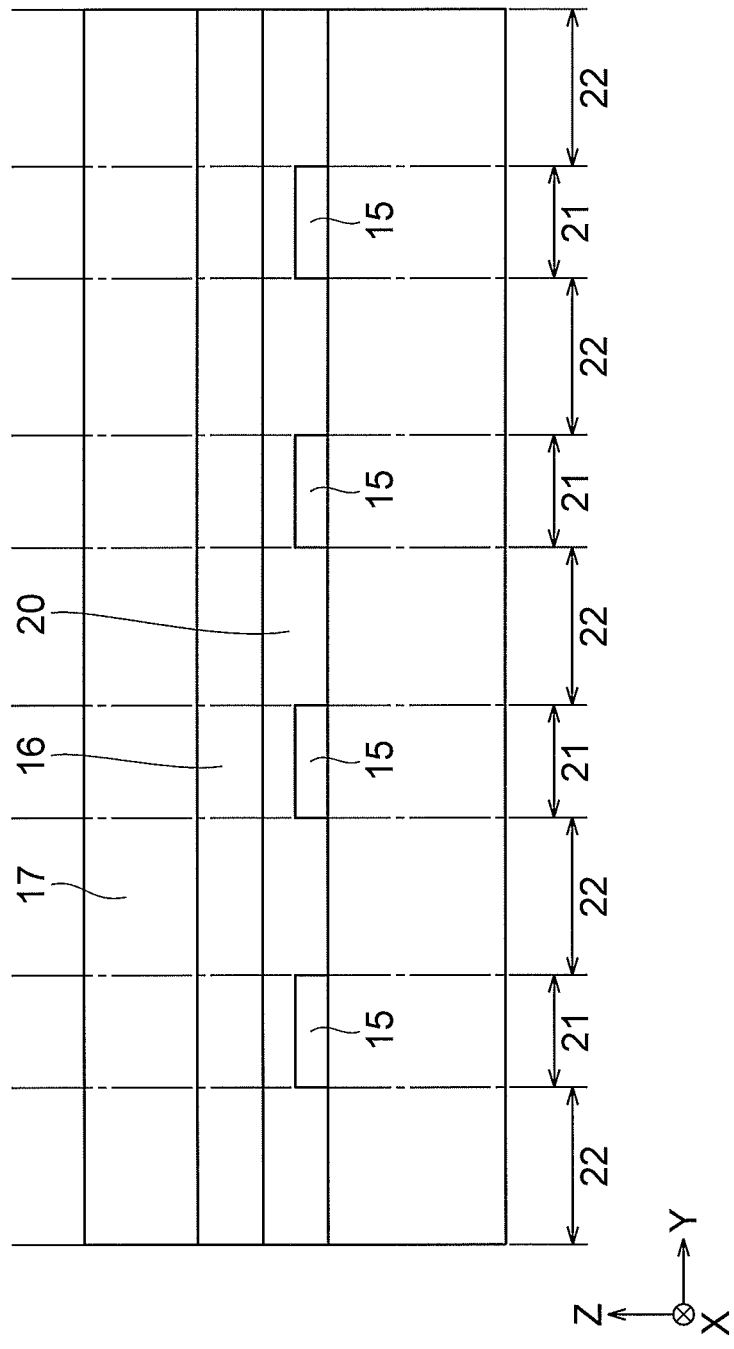
FIG. 4 is a cross-sectional view schematically illustrating the display device as viewed from a section line IV-IV depicted in FIG. 3.
Figure 5:
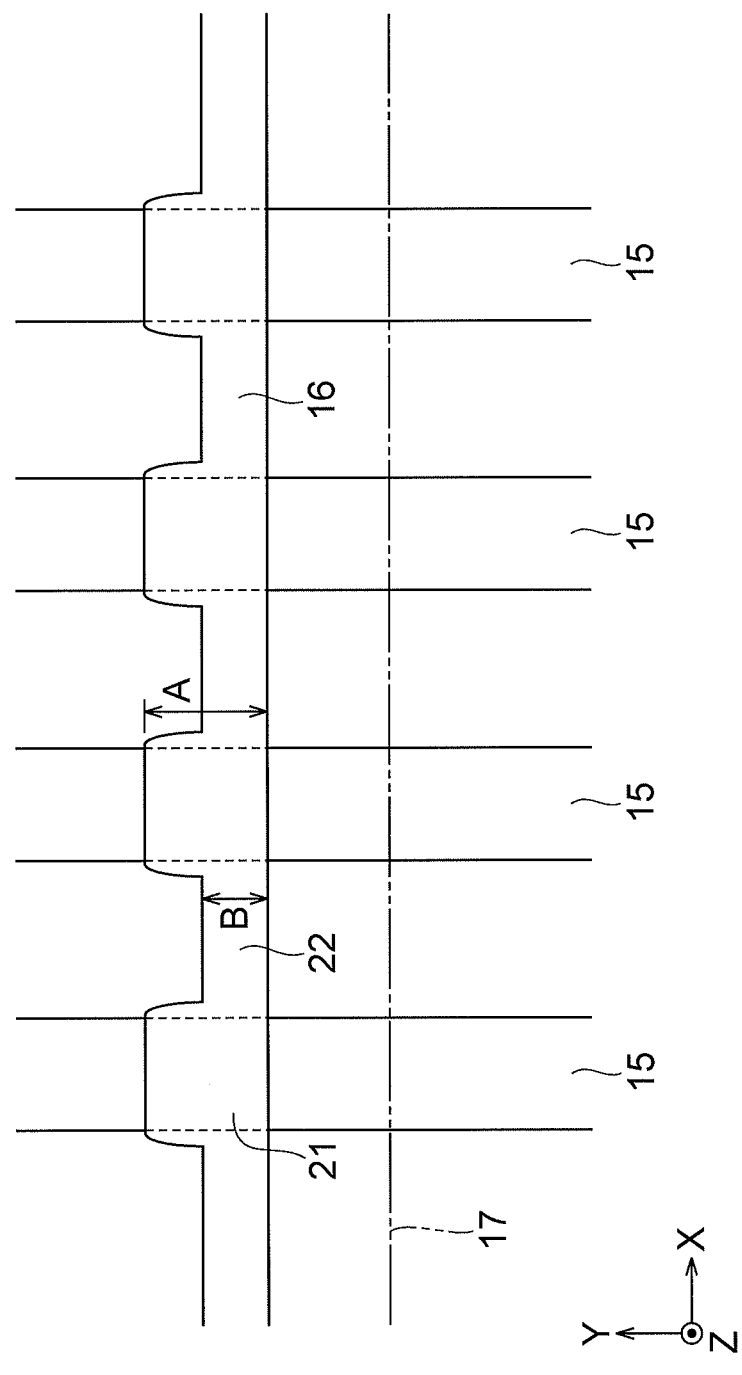
FIG. 5 is a diagram schematically illustrating a display device according to another embodiment, which is a plan view schematically illustrating a part corresponding to FIG. 3 in the display device according to another embodiment.

In the following, of the entire region in which the sealing member 16 extends in a two-dimensional view, a region in which the electric wiring 15 and the sealing member 16 intersect each other is referred to as an intersection region 21, and a remaining region excluding the intersection region 21 is referred to as a non-intersection region 22. FIG. 3 is an enlarged plan view schematically illustrating a region in which the intersection region 21 and the non-intersection region 22 alternately appear in the sealing member 16. FIG. 4 is a cross-sectional view schematically illustrating the display device as viewed from a section line IV-IV in FIG. 3. In FIG. 3 and FIG. 4, a plurality of electric wirings 15 each extend in the Y-axis direction, the sealing member 16 extends in the X-axis direction, and they are overlapped so as to intersect each other at a plurality of partial regions. FIG. 3 and FIG. 4 correspond to a partially enlarged view of one side located in the Y-axis negative direction in the sealing member 16 arranged in a rectangular shape in FIG. 1. FIG. 5 is a diagram schematically illustrating the display device according to another embodiment, which is a plan view schematically illustrating a part corresponding to FIG. 3 in the display device according to another embodiment.

In the present embodiment, the width (the Y-axis direction width: the size parallel to the electric wiring 15 at the intersection region 21) of the sealing member 16 differs between the intersection region 21 and the non-intersection region 22. In the following, the direction (the Y-axis direction) vertical to each of the thickness direction (the Z axis) of the support substrate 12 and the direction in which the sealing member 16 extends (the X-axis direction at the intersection region with the electric wiring) is defined as the width direction of the sealing member 16. Then, the width of the sealing member 16 means the width in the width direction of the sealing member 16.

As illustrated in FIG. 3, a width A of the sealing member 16 at the intersection region 21 and a width B of the sealing member 16 at the non-intersection region 22 are different from each other. By making the width A and the width B of the sealing member 16 different from each other in this manner, the sealing material on the intersection region 21 and the sealing material on the non-intersection region 22 can be heated in the same way when the sealing material serving as the sealing member 16 is heated.

In the present embodiment, the electric wiring 15 is arranged in the underlying layer on which the sealing member 16 is arranged. In a two-dimensional view, the electric wiring 15 is provided at the intersection region 21 but is not provided at the non-intersection region 22. A place where the electric wiring 15 is provided and a place where the electric wiring 15 is not provided exist in this way, so that the amount of heat flowing from the sealing material to the underlying layer differs between the intersection region 21 and the non-intersection region 22 when the sealing material serving as the sealing member 16 is heated.

In general, the thermal conductivity of the electric wiring 15 is greater by orders of magnitude than the thermal conductivity of the insulating film 20. Therefore, the thermal diffusion coefficient (=thermal conductivity/(thermal capacity× density)) of the underlying layer is generally greater at the intersection region 21 than at the non-intersection region 22. Thus, if a temperature difference between the sealing material and the underlying layer is the same between the non-intersection region 22 and the intersection region 21, heat of the sealing material flows through the underlying layer more at the intersection region 21 than at the non-intersection region 22. Meanwhile, the electric wiring 15 absorbs energy of the electromagnetic beam more than the insulating film 20. Therefore, the temperature of the electric wiring 15 may become higher than that of the insulating film 20. Furthermore, as the thermal diffusion coefficient of the electric wiring 15 is greater, the temperature of not only a part that directly absorbs energy of the electromagnetic beam but also the proximity to that part may rise. Therefore, the temperature of the underlying layer may become higher at the intersection region 21 than at the non-intersection region 22. As a result, heat of the sealing material may flow through the underlying layer less at the intersection region 21 than at the non-intersection region 22.

In this manner, the amount of heat flowing from the sealing material to the underlying layer differs between the intersection region 21 and the non-intersection region 22. Therefore, if the width A and the width B of the sealing member 16 are equal, when the sealing material is heated, the sealing material on the intersection region 21 and the sealing material on the non-intersection region 22 cannot be heated in the same way. Thus, in the present invention, the width A and the width B of the sealing member 16 are designed such that when the sealing material is heated, the sealing material on the intersection region 21 and the sealing material on the non-intersection region 22 can be heated in the same way.

In the case where the width A and the width B of the sealing member 16 are equal, when the sealing material is heated, the sealing material on the intersection region 21 reaches a higher temperature than the sealing material on the non-intersection region 22. Therefore, it is preferable to set the width A wider than the width B.

In the case where the width A of the sealing member 16 is set wider than the width B, the sealing member 16 may be shaped such that part of the sealing member 16 protrudes and extends on both sides in the width direction (the positive and negative directions of the Y-axis) at the intersection region 21 (see FIG. 3), or may be shaped such that part of the sealing member 16 protrudes and extends only on one side in the width direction (the positive direction of the Y-axis) at the intersection region 21 (see FIG. 5).

The width and thickness of the sealing member 16 are set in consideration of the required hermeticity, the characteristics of the sealing material, and other conditions. The width is generally about 500 µm to 2000 µm. The thickness is generally about 5 µm to 50 µm. The difference between the width A and the width B is set in consideration of the thermal characteristic of the underlying layer, the characteristics of the sealing material, and other conditions. In general, the difference is about 200 µm to 1000 µm.

In the present description, the intersection region 21 refers to a region in which the electric wiring 15 and the sealing member 16 intersect each other. However, in a case where the electric wirings are densely arranged, the entire region 21' (see FIG. 6) of the regions 21 in which the electric wirings are densely arranged is considered as a region in which electric wirings are provided, and the region 21' in which the region in which the electric wirings 15 are provided and the sealing member 16 intersect each other is also referred to as the intersection region in the present description. That is, in a two-dimensional view, in the intersection region 21' in which the region in which the electric wirings are densely arranged and the sealing member 16 intersect each other, the region in which the electric wiring 15 and the sealing member 16 intersect each other and the region in which the electric wiring 15 and the sealing member 16 do not intersect each other alternately appear repeatedly at high density. Then, a region in which the intersecting region and the not-intersecting region alternately appear repeatedly at high density is considered as a unit, which is referred to as the intersection region 21' in the present description. The region in which the electric wirings are densely arranged means that, for example, the distance between electric wirings is 1000 μm or less. It is assumed that the size in the width direction in a specific region is given by a value of the size at the center of the width direction of the specific region.

Figure 6:
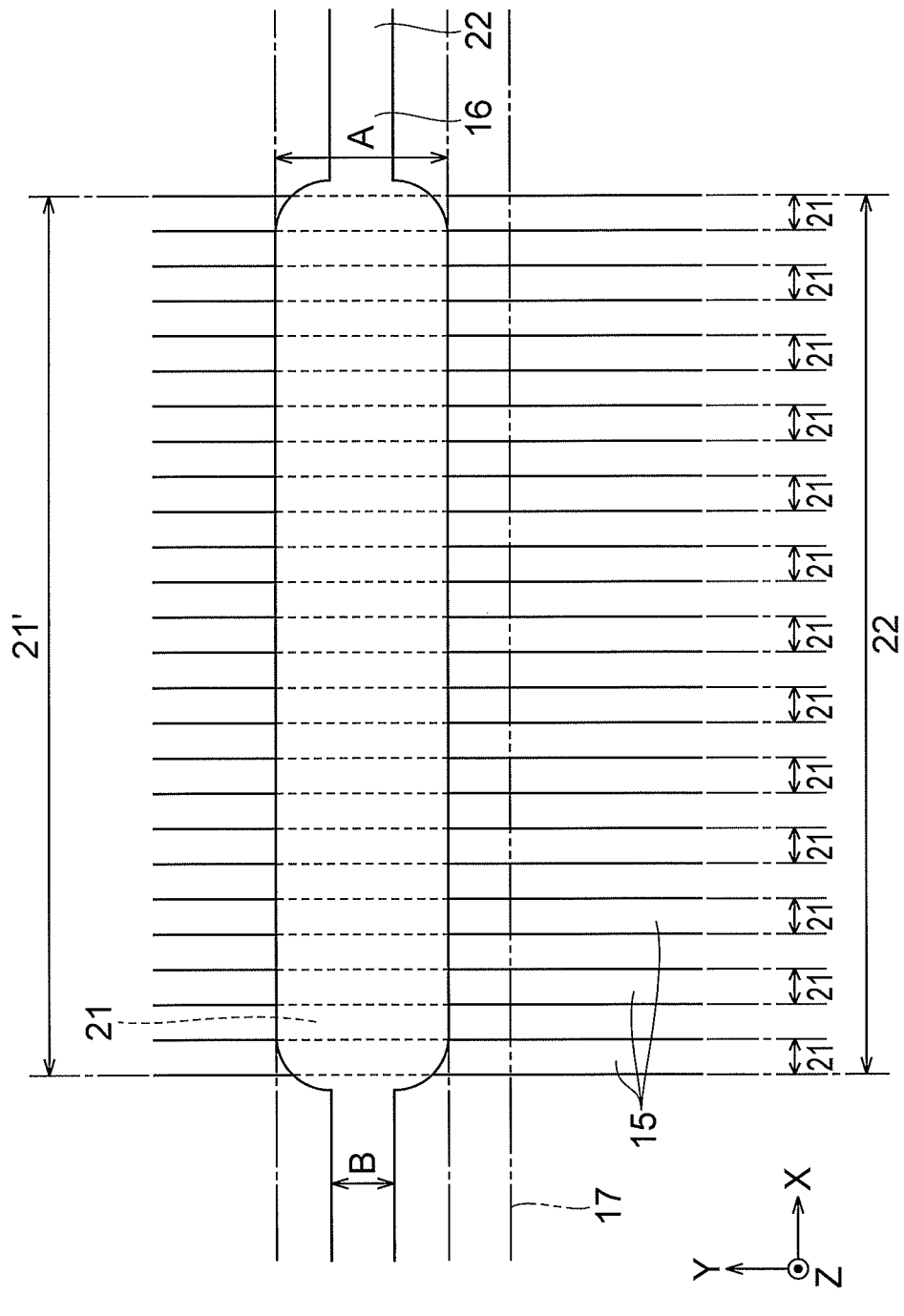
FIG. 6 is a diagram schematically illustrating an intersection region in which a region in which electric wirings are densely arranged intersects the sealing member.

FIG. 6 is a diagram schematically illustrating the intersection region 21' in which the region in which the electric wirings 15 are densely arranged and the sealing member intersect each other in a two-dimensional view. As illustrated in FIG. 6, the width A of the sealing member 16 in the intersection region 21' (or individual intersection regions 21) differs from the width B of the sealing member in the remaining non-intersection region 22 excluding the intersection region 21'. Also in the embodiment depicted in FIG. 6, it is preferable that the width A of the sealing member 16 at the intersection region 21' be wider than the width B of the sealing member 16 at the non-intersection region 22.

The sealing substrate 17 is bonded to the support substrate 12 with the sealing member 16 interposed therebetween. The sealing substrate 17 is formed of a glass plate, a metal plate, a resin film, and a stacked structure thereof. In the case where the top emission-type organic EL elements that emit light toward the sealing substrate 17 are mounted on the support substrate 12, the sealing substrate 17 is formed of a light-transmitting member.

<Method of Producing Display Device>

A method of producing a display device will now be described.

A method of producing the electric device according to the present invention includes the steps of preparing the support substrate on which the electric circuit and electric wirings are provided, supplying a sealing material serving as the sealing member along the outer periphery of the sealing region, bonding the sealing substrate to the support substrate with the sealing material serving as the sealing member interposed therebetween, irradiating the sealing material serving as the sealing member with an electromagnetic beam so that the sealing material is heated and fused, and forming the sealing member by cooling and hardening the sealing material. In the step of supplying the sealing material, the width of the sealing material supplied is varied between the intersection region and the intersection region.

(Step of Preparing Support Substrate on which Electric Circuit and Electric Wirings are Provided)

First, the support substrate 12 on which the electric circuit 14 and the electric wirings 15 are provided as illustrated in FIG. 1 is prepared. In the present embodiment, the support substrate 12 on which the electric circuit 14 having the circuits PC for driving the organic EL elements 24 and a plurality of organic EL elements 24 and the electric wirings 15 are formed is prepared. The support substrate 12 on which the electric circuit 14 and the electric wirings 15 are provided may be prepared by forming circuits PC for driving the organic EL elements 24 and the electric wirings 15 on the support substrate 12 and by additionally forming a plurality of organic EL elements 24 thereon.

The pixel circuits PC and the electric wirings 15 can be formed using a well-known semiconductor technique.

Figure 8:
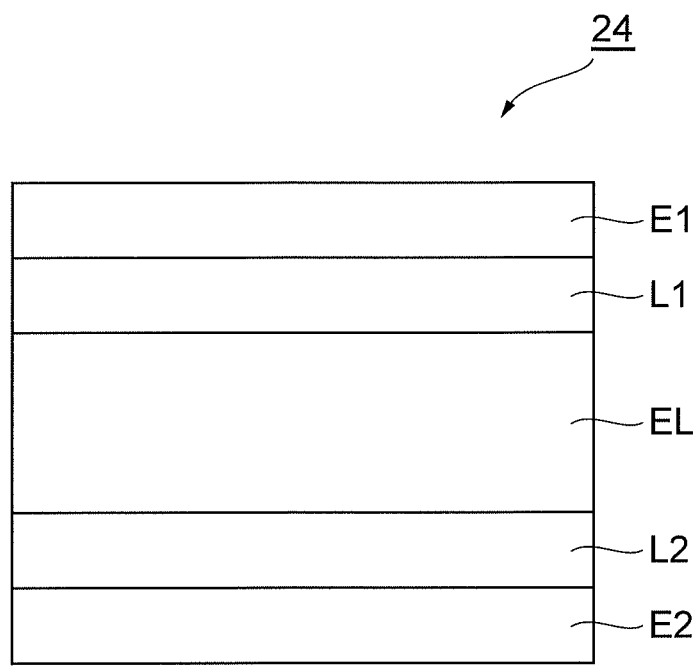
FIG. 8 is a diagram illustrating a section structure of an organic EL element.

The organic EL element 24 is configured such that a plurality of layers are stacked. Specifically, as illustrated in FIG. 8, the organic EL element 24 is configured to include a pair of electrodes E1 and E2 and a light-emitting layer EL provided between the electrodes E1 and E2. For example, the upper electrode E1 may be a cathode, and the lower electrode E2 may be an anode, or vice versa. The organic EL element 24 may include, in addition to the light-emitting layer EL, an anode-side organic layer L2 including a hole injection layer, a hole transport layer, an electron block layer, etc., and a cathode-side organic layer L1 including an electron injection layer, an electron transport layer, a hole block layer, etc., if necessary. The electrode E1 or E2 may be in direct contact with the light-emitting layer EL. The organic EL element 24 can be formed on the pixel circuit PC (see FIG. 7) by successively stacking the plurality of layers that constitute the organic EL element 24. The layers can be successively stacked by a dry method such as a vapor deposition method and a sputtering method, or a wet method such as an inkjet method, a nozzle printing method, and a spin-coating method.

(Step of Supplying Sealing Materials Serving as Sealing Member)

In this step, a sealing material serving as the sealing member is supplied along the outer periphery of the sealing region. The sealing material may be supplied to at least one of the support substrate 12 and the sealing substrate 17. In the present embodiment, the sealing material is supplied onto the sealing substrate 17.

A paste-like fit agent is used in the present embodiment as the sealing material in this manner. The paste-like fit agent is composed of fit glass powder and a vehicle. The vehicle is made of a binder and a solvent for dispersing the binder and the frit glass powder. A low melting-point glass powder that contains $V_2O_5$, VO, SnO, $SnO_2$, $P_2O_5$, $Bi_2O_3$, $B_2O_3$, ZnO, $SiO_2$, or other materials can be used as the frit glass powder. For example, BAS115, BNL 115BB-N, FP-74, and the like manufactured by ASAHI GLASS CO., LTD. can be used. Nitrocellulose, methyl acrylate, ethyl acrylate, butyl acrylate, ethyl cellulose, hydroxypropyl cellulose, butyl cellulose, or the like can be used as the binder. Butyl carbitol acetate, propylene glycol diacetate, methyl ethyl ketone, ethyl carbitol acetate, amyl acetate, and the like can be used as the solvent.

The sealing material can be supplied to at least one of the support substrate 12 and the sealing substrate 17 by a known coating method. For example, the sealing material can be supplied by a printing method such as a screen printing method, an offset printing method, an inkjet printing method, and a nozzle printing method, and a coating method using a dispenser. Among those, the screen printing method is preferred because the film thickness controllability such as uniformity of the film thickness of the sealing material on the coated surface and reproducibility of a coating state is excellent, and because the time required for coating is short.

In the step of supplying a sealing material, the width of the supplied sealing material is varied between the intersection region and the non-intersection region. More specifically, the width of the supplied sealing material is varied between the intersection region and the non-intersection region in a similar manner as the shape of the sealing member to be formed by hardening the sealing material. As a result, the width of the sealing member obtained by hardening the sealing material can be varied between the intersection region and the non-intersection region by varying the width of the sealing material between the intersection region and the non-intersection region in this manner.

Next, in the present embodiment, preliminary baking is performed. An unnecessary component in the sealing material can be removed by performing preliminary baking. Specifically, by performing preliminary baking, the solvent is vaporized, and the binder is burnt, whereby the vehicle is removed from the frit agent. As a result, the frit glass power is left on the sealing substrate 17. The preliminary baking is performed at temperatures that can remove the vehicle, for example, performed at 300° C. to 500° C. In a case where a member that is chemically changed when heated is provided on the sealing substrate 17 in addition to the sealing material, it is preferable to heat only the sealing material and the surrounding region in the preliminary baking. For example, in a case where part of the electric circuit is also formed on the sealing substrate, and the characteristics of the electric circuit are degraded by heat, it is preferable to perform preliminary baking so that the electric circuit formed on the sealing substrate is not heated. In the present embodiment, the sealing material is supplied onto the sealing substrate. However, supposing a case where the sealing material is supplied onto the support substrate, and the sealing material is then preliminarily baked, it is preferable to heat only the sealing material and the surrounding region in order to prevent the organic EL elements and the pixel circuits from being degraded by preliminary baking.

(Step of Bonding Sealing Substrate to Support Substrate)

Figure 9:
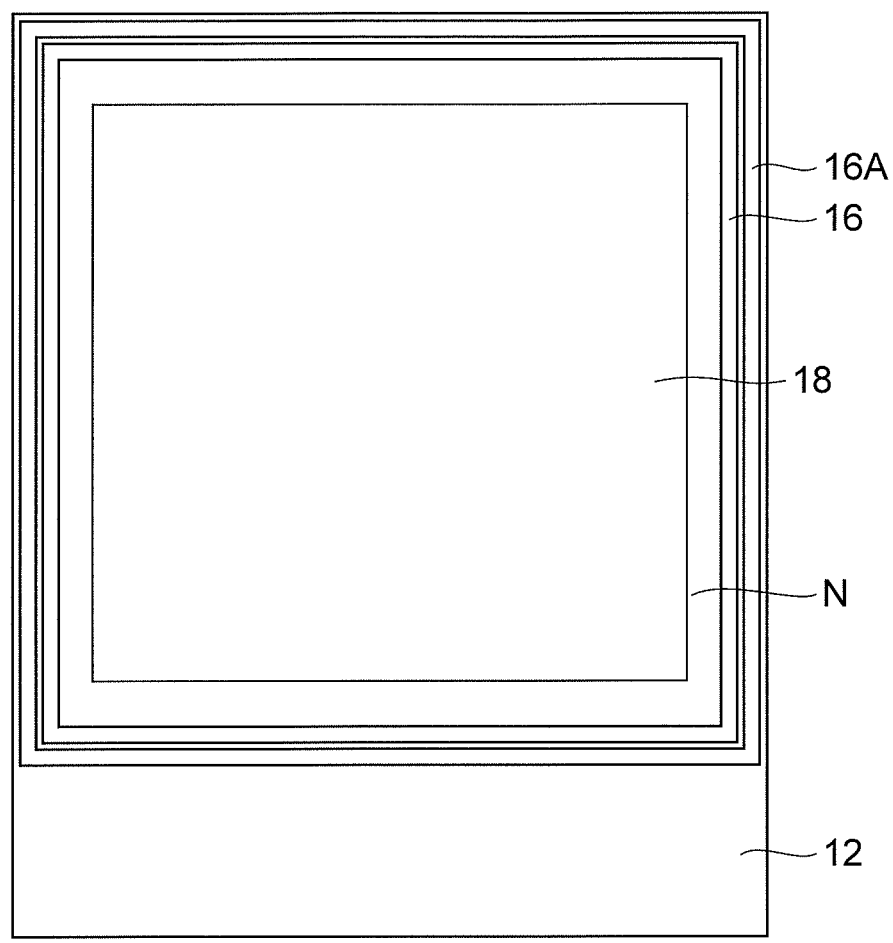
FIG. 9 is a plan view of the display device during production.

Next, the sealing substrate is bonded to the support substrate. In the present embodiment, preliminary sealing is performed using a light-curable resin. In the preliminary sealing, first, a light-curable resin is supplied to the outside of the sealing material along the sealing material, and then, the sealing substrate 17 is bonded to the support substrate 12 in a vacuum or in an inert gas atmosphere. FIG. 9 is a plan view of the display device after bonding the substrates, in which depiction of the sealing substrate 17 is omitted. A preliminary sealing member 16A is positioned to surround the outside of the sealing member 16. A filling material N may be filled in a sealed space. The sealing region is preliminarily sealed by irradiating the light-curable resin with light to cure the light-curable resin.

For example, ultraviolet-curable epoxy resin and ultraviolet-curable acrylic resin can be used as a light-curable resin. Although the light-curable resin is not depicted in FIG. 1 to FIG. 6, in actuality, for example in FIG. 1, two lines corresponding to the sealing member 16 and the light-curable resin serving as the preliminary sealing member 16A extend along the outer periphery of the sealing region similar to the illustration in FIG. 9, because the light-curable resin extends along the sealing member 16 in the case where the preliminary sealing is performed. In a case where the light-curable resin and the sealing member 16 are arranged in proximity to each other, it is preferable that the light-curable resin and the sealing member 16 be arranged at least 0.5 mm apart from each other because the light-curable resin may be burnt when the sealing material is heated and fused by a laser.

In another embodiment, a part that is necessary for preliminary sealing but unnecessary for the configuration of the electric device may be detached from the electric device after the frit sealing. For example, the substrate may be divided between the light-curable resin used in the preliminary sealing and the sealing member, and the part where the light-curable resin is arranged may be detached as an unnecessary part from the electric device. In this case, during preliminary sealing, the light-curable resin may be arranged apart from the sealing member 16 by a prescribed distance so as to surround the sealing member 16.

In the case where preliminary sealing is performed in a vacuum, the degree of vacuum is preferably 1 Pa to 90 kPa. In the case where preliminary sealing is performed in an inert gas atmosphere, the preliminary sealing is preferably performed in an inert gas atmosphere with a dew point of −70° C. or lower. Argon or nitrogen can be used as an inert gas. Ultraviolet rays can be used as light emitted to the light-curable resin. By performing the preliminary sealing in a vacuum or in an inert gas atmosphere, the moisture concentration and the oxygen concentration in the sealing region can be reduced to be lower than those of the atmosphere. Although the hermeticity is low in the preliminary sealing, frit sealing as described later is performed in the preliminarily sealed state to enhance the hermeticity, whereby the moisture concentration and the oxygen concentration in the sealing region can be kept lower than those of the atmosphere.

The bonding between the sealing substrate 17 and the support substrate 12 may be performed using an alignment mark as a reference. For example, the sealing substrate 17 and the support substrate 12 may be given respective alignment marks in advance, and the positions of the alignment marks may be recognized using an optical sensor. Then, alignment of the sealing substrate 17 and the support substrate 12 is performed based on the recognized positional information. Thereafter, the sealing substrate 17 and the support substrate 12 may be bonded together.

(Step of Heating and Fusing Sealing Material)

In the present embodiment, after the preliminary sealing, the sealing material is heated and fused in the atmosphere. The heating and fusing of the sealing material is performed by irradiating the sealing material serving as the sealing member 16 with an electromagnetic beam.

The irradiation of an electromagnetic beam is performed from the sealing substrate 17 side, of the support substrate 12 and the sealing substrate 17. Specifically, a head for emitting an electromagnetic beam (hereinafter also referred to as an electromagnetic beam irradiation head) is arranged above the sealing substrate 17 to irradiate the sealing substrate 17 with an electromagnetic beam. The electromagnetic beam emitted from the electromagnetic beam irradiation head passes through the sealing substrate 17 and the sealing material is irradiated with the electromagnetic beam. Light having a high energy density is suitably used as the electromagnetic beam. Laser light is suitably used. In other words, a member through which an electromagnetic beam passes is suitably used as the sealing substrate 17, and a material that absorbs an electromagnetic beam is suitably used as the sealing material. The peak wavelength of light to be used as an electromagnetic beam is generally 190 nm to 1200 nm, and preferably 300 nm to 1100 nm. Examples of a laser device that emits an electromagnetic beam may include a YAG laser, a semiconductor laser (diode laser), an argon ion laser, and an excimer laser.

The irradiation of an electromagnetic beam can be performed, for example, using a control device capable of three-dimensionally moving the electromagnetic beam irradiation head. For example, the electromagnetic beam irradiation head may be arranged at a prescribed distance from the sealing material, and the electromagnetic beam irradiation head may be scanned along the sealing material while irradiating the sealing material with an electromagnetic beam. Although the irradiation of an electromagnetic beam may be performed with the light intensity of the electromagnetic beam being varied, it is preferable that throughout the entire region in which the sealing material is arranged be irradiated with the electromagnetic beam at the same light intensity. This is because the setting of the device is easy. When the light intensity is varied, the scanning speed of the electromagnetic beam irradiation head may be reduced at that time. However, in the case of scanning the electromagnetic beam irradiation head with a light intensity being kept constant, the time required for the electromagnetic beam irradiation head to make a round along the sealing material can be shortened. As long as the electromagnetic beam irradiation head is scanned relative to the sealing substrate 17 and the support substrate 12 bonded together, the irradiation of an electromagnetic beam is not only performed by moving the electromagnetic beam irradiation head but maybe by moving the sealing substrate 17 and the support substrate 12 bonded together or may be performed by moving both the sealing substrate 17 and the support substrate 12 bonded together as well as the electromagnetic beam irradiation head. The movement of sealing substrate 17 and the support substrate 12 bonded together can be carried out by placing the sealing substrate 17 and the support substrate 12 bonded together on a stage having a moving mechanism and by moving this stage.

It is preferable to adjust the spot diameter of the electromagnetic beam. In the present description, the diameter of the electromagnetic beam at a position where the sealing material is irradiated is described as a spot diameter C. The size of the spot diameter C can be adjusted by using an optical element such as a condenser lens. In the present description, the spot diameter C means a diameter of an approximately circular closed curve obtained by connecting positions where the light intensity is "1/e^2" with respect to the light intensity on the optical axis when the electromagnetic wave is cut along a plane perpendicular to the optical axis, where the symbol "e" represents Napier's constant. Although the approximately circular closed curve is not always a perfect circle, the diameter of the approximately circular closed curve can be obtained by approximating the approximately circular closed curve to a circle and calculating the diameter of the circle.

It is preferable that the spot diameter C of the electromagnetic beam be greater than the width B of the sealing member 16 at the non-intersection region. By making the spot diameter C greater than the width B of the sealing member 16 at the non-intersection region in this manner, the sealing member 16 can be heated entirely in the width direction, thereby preventing the sealing member 16 from being locally heated.

It is preferable that the spot diameter C of the electromagnetic beam be equal to the width A of the sealing member 16 at the intersection region or greater than the width A. By making the sport diameter C equal to the width A of the sealing member 16 at the intersection region or making the spot diameter C greater than the width A, the sealing member 16 can be heated entirely in the width direction even at the intersection regions, thereby preventing the sealing member from being locally heated.

The sealing member can be uniformly heated throughout the width direction in some cases even without increasing the spot diameter C, because at the intersection region, heat is easily made uniform along the electric wiring 15. In this case, it is preferable that the spot diameter C of the electromagnetic beam be smaller than the width A of the sealing member 16 at the intersection region and be greater than the width B of the sealing member 16 at the non-intersection region. By reducing the spot diameter C of the electromagnetic beam in this manner, the energy density can be increased, so that the sealing member 16 can be heated and fused efficiently.

(Step of Forming Sealing Member)

Next, the sealing member is formed by cooling and hardening the fused sealing material. The fused sealing material may be cooled by decreasing the temperature surrounding the display device, or the temperature may be decreased by natural cooling. For example, the temperature of the sealing material is decreased naturally by stopping irradiation of the electromagnetic beam, so that the fused sealing material hardens naturally.

As described above, in the present embodiment, in a two-dimensional view, the width of the sealing member is varied between the intersection region in which the electric wiring and the sealing member intersect each other and the non-intersection region excluding the intersection region. In the step of forming the sealing member, the width of the sealing material is varied. By varying the width of the sealing material in this manner, the sealing material can be heated uniformly throughout the entire periphery thereof. As a result, the characteristics of the sealing member can be made uniform throughout the entire periphery of the sealing member, and the adhesion between the sealing member, and the support substrate and the sealing substrate can be made uniform. Accordingly, a highly reliable display device can be implemented. In the present embodiment, a difference in temperature increase of the sealing material between the intersection region 21 and the non-intersection region 22 is reduced by adjusting the width of the sealing member. Therefore, it is not necessary to change the shape of electric wiring, so that a highly reliable display device can be implemented while flexibility of design of electric wiring is kept.

The display device in such a manner that the electric circuit is provided on the support substrate has been described above. An electric circuit may be provided also on the sealing substrate. For example, the pixel circuits for driving part of the electric circuit may be provided on the support substrate while the organic EL elements may be provided on the sealing substrate. The pixel circuit provided on the support substrate and the organic EL element provided on the sealing substrate are electrically connected with each other through a prescribed conductive member.

In the foregoing display device, the display device in which the organic EL element is provided as an electronic element having an organic layer has been described. However, an organic transistor as the electronic element having an organic layer may be used as the transistor that constitutes part of the pixel circuit.

REFERENCE SIGNS LIST 11 display device
12 support substrate
13 sealing region
14 electric circuit
15 electric wiring
16 sealing member
17 sealing substrate
18 image display region
19 electrical signal input/output source
20 insulating film
21 intersection region
24 organic EL element

The invention claimed is:

1. An electric device comprising:
a support substrate;
an electric circuit provided in a sealing region set on the support substrate;
an electric wiring provided on the support substrate to extend from an inside of the sealing region to an outside of the sealing region for electrically connecting an external electrical signal input/output source with the electric circuit;

a sealing member provided on the support substrate to surround the sealing region; and a sealing substrate bonded to the support substrate with the sealing member interposed therebetween, wherein the electric circuit includes an electronic element having an organic layer, and in a two-dimensional view, a width of an intersection region differs from a width of a non-intersection region excluding the intersection region, the intersection region being a region of the sealing member in which the electric wiring and the sealing member intersect each other.

2. The electric device according to claim 1, wherein a width A of the sealing member at the intersection region is greater than a width B of the sealing member at the non-intersection region.

3. The electric device according to claim 1, wherein the electronic element is an organic EL element, an organic photoelectric transducer element, or an organic transistor.

4. A method of producing the electric device according to claim 1, the method comprising the steps of:

preparing the support substrate on which the electric circuit and the electric wiring are provided;

supplying a sealing material serving as the sealing member along an outer periphery of the sealing region;

bonding the sealing substrate to the support substrate with the sealing material serving as the sealing member interposed therebetween;

irradiating the sealing material serving as the sealing member with an electromagnetic beam to heat and fuse the sealing material; and forming the sealing member by cooling and hardening the sealing material, wherein in the step of supplying a sealing material, a width of the supplied sealing material is varied between the intersection region and the non-intersection region.

5. The method of producing the electric device according to claim 4, wherein throughout an entire region in which the sealing material is arranged is irradiated with the electromagnetic beam at an identical light intensity.

6. The method of producing the electric device according to claim 4, wherein a spot diameter C of the electromagnetic beam is greater than a width B of the sealing member at the non-intersection region.

7. The method of producing the electric device according to claim 6, wherein a width A of the sealing member at the intersection region is greater than the width B of the sealing member at the non-intersection region, and the spot diameter C of the electromagnetic beam is equal to the width A of the sealing member at the intersection region or greater than the width A.

8. The method of producing the electric device according to claim 6, wherein a width A of the sealing member at the intersection region is greater than the width B of the sealing member at the non-intersection region, and the spot diameter C of the electromagnetic beam is smaller than the width A of the sealing member at the intersection region.

* * * * *